(12) United States Patent
Akahori (10) Patent No.: US 11,289,744 B2
(45) Date of Patent: Mar. 29, 2022

(54) BATTERY UNIT, BATTERY MONITORING SYSTEM, AND BATTERY REPLACEMENT METHOD

(71) Applicant: LAPIS Semiconductor Co., Ltd., Yokohama (JP)

(72) Inventor: Hiroji Akahori, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 274 days.

(21) Appl. No.: 16/137,697

(22) Filed: Sep. 21, 2018

(65) Prior Publication Data

US 2019/0089022 A1    Mar. 21, 2019

(30) Foreign Application Priority Data

Sep. 21, 2017   (JP) .............................. JP2017-181615

(51) Int. Cl.
| | |
|---|---|
| *H02J 7/00* | (2006.01) |
| *H01M 10/48* | (2006.01) |
| *H01Q 1/22* | (2006.01) |
| *H01Q 7/06* | (2006.01) |
| *H01M 10/42* | (2006.01) |
| *H01M 10/44* | (2006.01) |

(Continued)

(52) U.S. Cl.
CPC ........ *H01M 10/482* (2013.01); *G01R 31/371* (2019.01); *G01R 31/396* (2019.01); *H01M 10/425* (2013.01); *H01M 10/4285* (2013.01); *H01M 10/441* (2013.01); *H01Q 1/225* (2013.01); *H01Q 7/06* (2013.01); *H02J 7/0021* (2013.01); *H01M 2010/4271* (2013.01)

(58) Field of Classification Search
CPC .................................................. H01M 10/482
USPC .......................................................... 320/134
See application file for complete search history.

(56) References Cited

U.S. PATENT DOCUMENTS

| | | | |
|---|---|---|---|
| 2005/0212482 A1* | 9/2005 | Nakada ................. | H02J 7/0016 320/120 |
| 2008/0297107 A1* | 12/2008 | Kato ....................... | H02J 7/025 320/108 |

(Continued)

FOREIGN PATENT DOCUMENTS

JP      2016-096082 A      5/2016

*Primary Examiner* — Yalkew Fantu
(74) *Attorney, Agent, or Firm* — Rabin & Berdo, P.C.

(57) ABSTRACT

A battery monitoring system prevents damage to a device utilizing stacked battery cells, reduces the time required for battery replacement, and increases the capacity and reduces the size of the battery monitoring system.

A battery unit includes: two or more battery cells configured to generate a DC voltage; two or more measurement units configured to measure a voltage value of the two or more battery cells and obtain measurement signals representing a measurement result; two or more transmission loop antennas configured to generate an AC magnetic field corresponding to the measurement signals; a reception loop antenna configured to receive the AC magnetic fields and generate a reception signal corresponding to the AC magnetic fields; a receiver configured to demodulate the reception signal to generate information representing the measurement results; and a magnetic core that runs through the transmission loop antennas and the reception loop antenna.

10 Claims, 7 Drawing Sheets

(51) Int. Cl.
G01R 31/396 (2019.01)
G01R 31/371 (2019.01)

(56) References Cited

U.S. PATENT DOCUMENTS

| | | | | |
|---|---|---|---|---|
| 2010/0264746 A1* | 10/2010 | Kazama | ................ | H04W 52/18 |
| | | | | 307/104 |
| 2011/0316475 A1* | 12/2011 | Jung | ........................ | H02J 7/04 |
| | | | | 320/108 |
| 2014/0035526 A1* | 2/2014 | Tripathi | ................ | B60L 53/665 |
| | | | | 320/109 |
| 2016/0172896 A1* | 6/2016 | Hidaka | ................ | H04B 5/0037 |
| | | | | 320/108 |

* cited by examiner

BATTERY UNIT, BATTERY MONITORING SYSTEM, AND BATTERY REPLACEMENT METHOD

BACKGROUND OF THE INVENTION

Technical Field

The present invention relates to a battery unit including a plurality of battery cells, a battery monitoring system that monitors a battery unit, and a battery replacement method.

Background Arts

To date, a storage battery unit having a plurality of battery modules, each of which contains an electrochemical cell (for example, a lithium ion secondary battery), is proposed as a direct current power supply (for example, see Japanese Patent Application Laid-open Publication No. 2016-96082).

In this storage battery unit, the battery modules are locked in the respective positions by a bolt passing through the through holes provided in each of the plurality of battery modules. In addition, the electrochemical cells contained in the respective battery modules are electrically connected in series or in parallel.

SUMMARY OF THE INVENTION

If such a storage battery unit is used as a power source for a driving motor of an electric vehicle, it is necessary to monitor the state of the individual electrochemical cell (hereinafter referred to as a battery cell) contained in the storage battery unit in order to prevent damage to the storage battery unit.

Therefore, an in-vehicle storage battery unit is equipped with a battery monitoring system that individually monitors a plurality of battery cells. The battery monitoring system includes, for example, a plurality of wiring lines for individually taking in voltages generated in the respective battery cells, and a battery management unit for monitoring the state of each battery cell based on the voltage taken in through the plurality of wiring lines.

In the battery monitoring system described above, if abnormality occurs in the battery cell, a high voltage may be applied to the battery management unit via the wiring line connected to the battery cell. This high voltage possibly damages the battery management unit.

Further, in order to adopt such a battery monitoring system, it is necessary to secure a space for installing the plurality of wiring lines, in addition to the space for accommodating a plurality of battery cells in the storage battery unit. This causes an increase in size of the storage battery unit, making it difficult to increase the capacity of the storage battery unit.

Furthermore, when the storage battery unit is to be replaced, it is necessary to remove all of the plurality of wiring lines, and reconnect them to the replacement storage battery unit, which would cause the replacement work to take longer.

In order to solve the above-described problems, the present invention provides a battery unit, a battery monitoring system, and a battery replacement method that can ensure damage prevention and a reduction in time required for the battery replacement work as well as an increase in capacity and a reduction in size of the battery.

A battery unit of the present invention includes: first to n-th (n is an integer of 2 or greater) battery cells each generating a DC voltage; first to n-th measurement units configured to measure a voltage value of each of the first to n-th battery cells, and obtain first to n-th measurement signals respectively representing the measurement results; first to n-th transmission loop antennas configured to generate a AC magnetic field corresponding to each of the first to n-th measurement signals; a reception loop antenna configured to receive the AC magnetic field and obtain a reception signal corresponding to the AC magnetic field; a receiver configured to conduct a demodulation process on the reception signal to generate information representing the measurement result; and a magnetic core that runs through the first to n-th transmission loop antennas and the reception loop antenna.

A battery monitoring system of the present invention includes: first to n-th (n is an integer of 2 or greater) battery cells each generating a DC voltage; first to n-th measurement units configured to measure a voltage value of each of the first to n-th battery cells, and obtain first to n-th measurement signals respectively representing the measurement results; first to n-th transmission loop antennas configured to generate a AC magnetic field corresponding to each of the first to n-th measurement signals; a reception loop antenna configured to receive the AC magnetic field and obtain a reception signal corresponding to the AC magnetic field; a receiver configured to conduct a demodulation process on the reception signal to generate battery cell measurement information representing the measurement result; a magnetic core that runs through the first to n-th transmission loop antennas and the reception loop antenna; and a battery management device configured to monitor the current state of the first to n-th battery cells and control a discharge or charge process of the first to n-th battery cells, based on the battery cell measurement information.

A battery replacement method of the present invention is a battery replacement method for a battery unit including: first to n-th (n is an integer of 2 or greater) battery cells each generating a DC voltage; first to n-th measurement units configured to measure a voltage value of each of the first to n-th battery cells, and obtain first to n-th measurement signals respectively representing the measurement results; first to n-th transmission loop antennas formed respectively in the first to n-th battery cells and configured to generate an AC magnetic field corresponding to each of the first to n-th measurement signals; a reception loop antenna configured to receive the AC magnetic field and obtain a reception signal corresponding to the AC magnetic field; a receiver configured to conduct a demodulation process on the reception signal to generate battery cell measurement information representing the measurement result; and a magnetic core that runs through the first to n-th transmission loop antenna and the reception loop antenna, the battery replacement method including: a first step of detecting a battery cell with abnormality among the first to n-th battery cells; a second step of removing the magnetic core; a third step of removing, among the first to n-th battery cells, the battery cell with abnormality that was detected in the first step; a fourth step of installing a new battery cell; and a fifth step of inserting the magnetic core through the first to n-th transmission loop antennas and the reception loop antenna.

In embodiments of the present invention, the voltage value of each of the plurality of battery cells is measured, and the measurement result of each battery cell is transmitted through wireless communication. Thus, the DC voltage generated in each battery cell is not applied on the battery management unit. This prevents a high voltage from being applied to the battery management unit even if abnormality occurred in the battery cell, which makes it possible to prevent damage due to the abnormality. Furthermore, because a plurality of wiring lines connecting the battery management unit to each battery cell is no longer necessary, the space for accommodating such wiring lines can be eliminated, which allows for an increase in capacity of each battery cell or a reduction in size of the battery unit constituted of the battery cells.

Also, in embodiments of the present invention, the magnetic field coupling is employed as a method to wirelessly transmit measurement results of each battery cell. This eliminates the necessity of power wiring lines to supply the power to the receiver side, and therefore, it is possible to suppress an increase in size of the device.

In embodiments of the present invention, attenuation of the AC magnetic field generated by the transmission loop antenna is suppressed by inserting a common magnetic core, which contains a magnetic material, through the plurality of transmission loop antennas that emit AC magnetic fields and the reception loop antenna. This makes it possible to increase the communication distance, which allows for an increase in the number of battery cells stacked, and as a result, the battery capacity can be greater.

According to embodiments of the present invention, when the battery cell is to be replaced, all it takes is to pull out the magnetic core, and each battery cell can be removed. Furthermore, after a new battery cell is placed, by inserting the magnetic core through the transmission loop antennas and the reception loop antenna, the battery cells are connected to the battery management unit.

Thus, it is possible to reduce the time required to replace the battery cell as compared to the case in which a plurality of wiring lines connecting the battery cells to the battery management unit need to be removed and reconnected in the battery replacement process.

DETAILED DESCRIPTION OF THE INVENTION

Embodiments of the present invention will be explained below with reference to figures.

Figure 1:
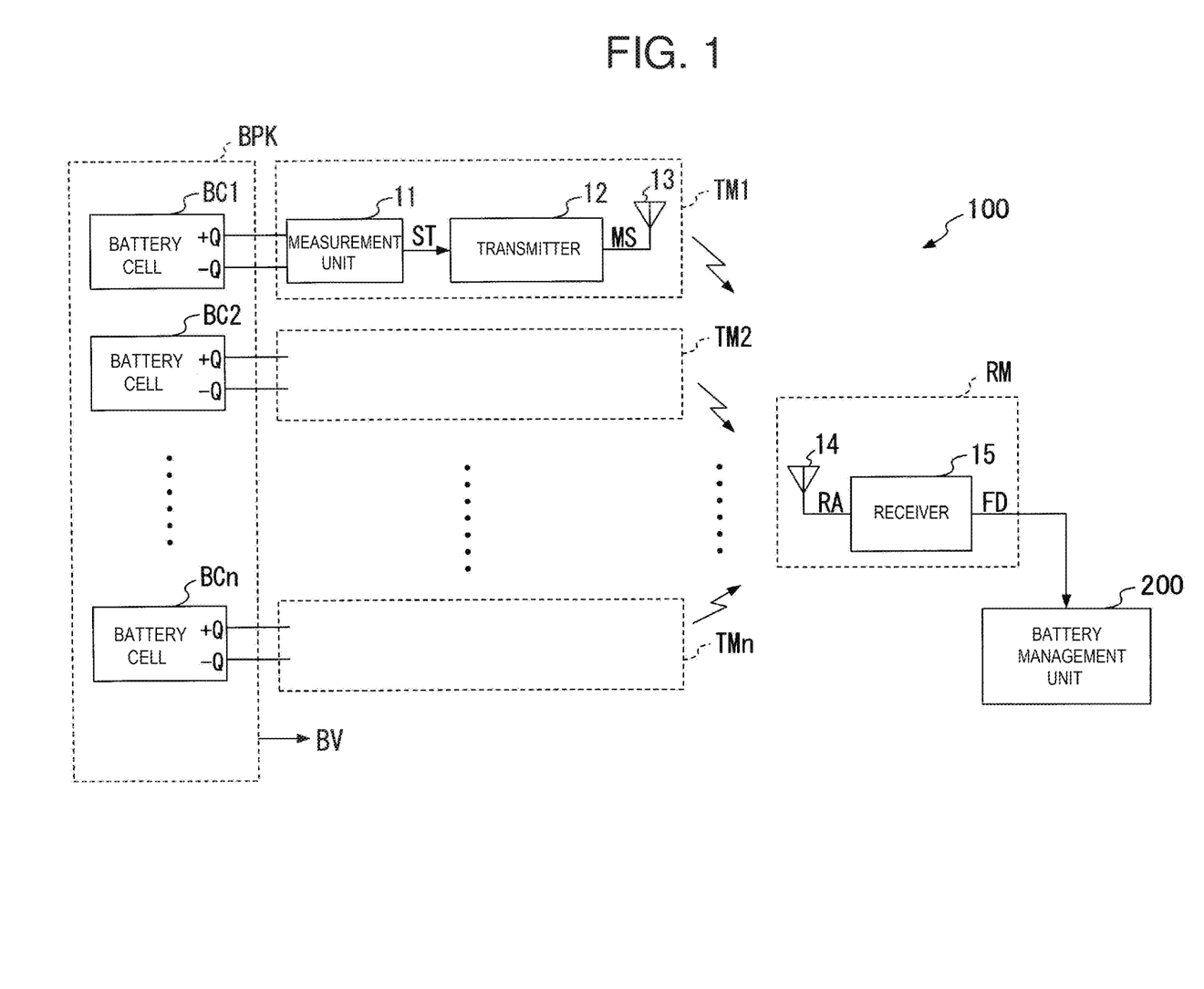
FIG. 1 is a block diagram showing the configuration of a battery unit 100 according to an embodiment of the present invention.

FIG. 1 is a block diagram showing the configuration of a battery unit 100 according to an embodiment of the present invention. The battery unit 100 includes a battery pack BPK accommodating a plurality of battery cells BC1 to BCn (n is an integer of 2 or greater), transmission modules TM1 to TMn provided for the respective battery cells BC1 to BCn, and a reception module RM.

The battery cells BC1 to BCn are each a secondary battery, for example, where a DC voltage generated inside is output through the positive terminal +Q and the negative terminal −Q. The battery cells BC1 to BCn are connected to each other in series in the battery pack BPK. Some battery cells BC among the plurality of battery cells BC1 to BCn may be connected in parallel. The battery pack BPK outputs a battery voltage BV having a voltage value obtained by combining DC voltages generated by the respective battery cells BC1 to BCn.

The transmission modules TM1 to TMn each have the same internal configuration. That is, as shown in FIG. 1, each of the transmitter modules TM1 to TMn includes a measurement unit 11, a transmitter 12, and a transmission loop antenna 13.

Below, using the transmission module TM1 as an example, the measurement unit 11, the transmitter 12, and the transmission loop antenna 13 will be explained.

The measurement unit 11 of the transmission module TM1 is connected to the positive terminal +Q and the negative terminal −Q of the battery cell BC1. The measurement unit 11 measures the voltage value and the current amount of the DC voltage generated by the battery cell BC1 through the positive terminal +Q and the negative terminal −Q of the battery cell BC1, and outputs a measurement signal ST representing the measured voltage value and current amount to the transmitter 12.

The transmitter 12 performs wireless communication by magnetic field coupling based on a short-range wireless communication technology such as NFC (Near Field Communication). That is, the transmitter 12 generates a modulation signal MS by performing modulation on the carrier wave of a predetermined frequency (for example, 13.56 MHz) based on the measurement signal ST, and supplies the modulation signal MS to the transmission loop antenna 13.

The transmission loop antenna 13 generates an AC magnetic field corresponding to the modulation signal MS and releases the magnetic field to the space.

As described above, the transmission modules TM1 to TMn each including the measurement unit 11, the transmitter 12 and the transmission loop antenna 13 first obtain the first to n-th measurement signals ST that each represent the measurement results (voltage value, current amount) for each of the battery cells BC1 to BCn. Thereafter, the transmission modules TM1 to TMn generate an AC magnetic field based on each of the first to n-th measurement signals ST from the first to n-th transmission loop antennas 13.

The reception module RM includes a reception loop antenna 14 and a receiver 15.

The reception loop antenna 14 receives the AC magnetic field emitted by the transmission loop antenna 13 of each of the transmission modules TM1 to TMn, and supplies a reception signal RA corresponding to the AC magnetic field to the receiver 15.

The receiver 15 conducts the processes described below on the reception signal RA by the magnetic field coupling.

That is, first, the receiver 15 generates an AC voltage based on the reception signal RA, and conducts rectification and smoothing on this AC voltage to generate a power source voltage. The receiver 15 is activated by this power source voltage, and first, extracts an n-system modulation signal MS generated from the reception signal RA in the transmission modules TM1 to TMn. Next, the receiver 15 restores the measurement signal ST representing the voltage value and the current amount of each of the battery cells BC1 to BCn by conducting a demodulation process on each of the extracted n-system modulation signals MS. The receiver 15 then supplies battery cell measurement information FD that represents the voltage value and current amount of each of the battery cells BC1 to BCn, which was restored, to a battery management unit 200 that manages the state of the battery unit 100.

The battery management unit 200 monitors the current state of the battery cells BC1 to BCn based on the battery cell measurement information FD. For example, the battery management unit 200 monitors the remaining capacity and the charging state of the battery cells BC1 to BCn or detects the battery cell with operation abnormality based on the battery cell measurement information FD, and generates the battery state information indicating the result thereof. Furthermore, the battery management unit 200 conducts the charge and discharge control that commands the charge/discharge unit (not shown in FIG. 1), which is configured to charge and discharge the battery cells BC1 to BCn, to perform a charge operation or discharge operation.

Figure 2:
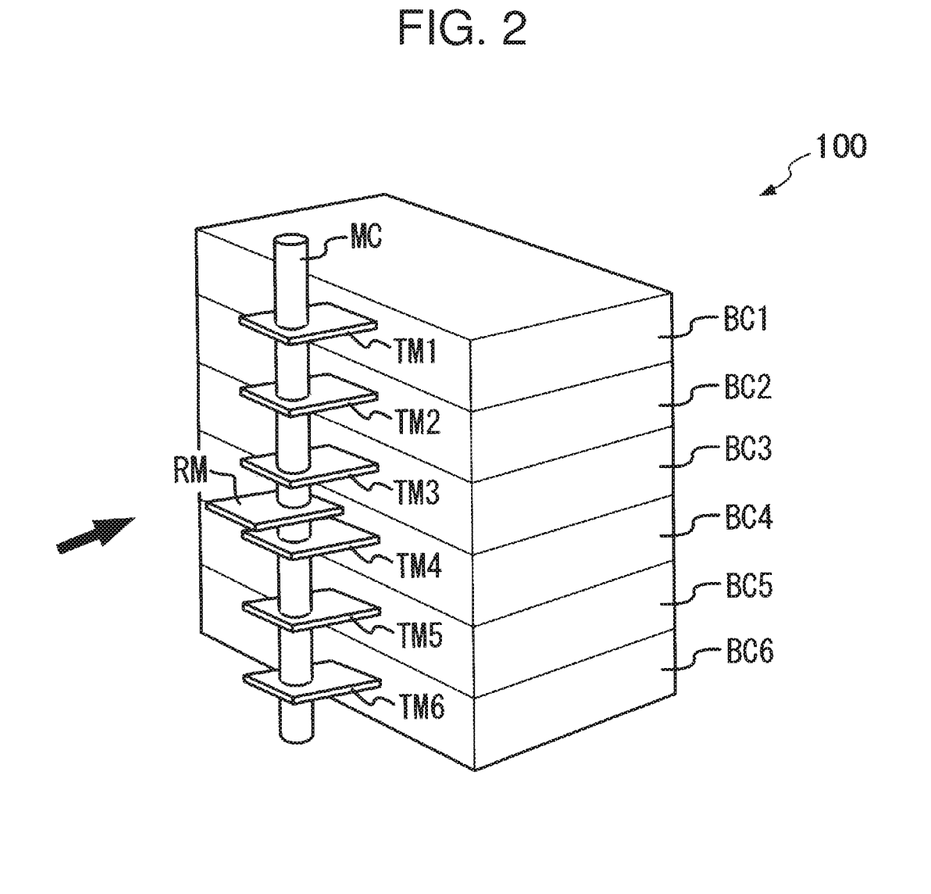
FIG. 2 is a perspective view showing an example of the exterior of the battery unit 100.

FIG. 2 is a perspective view showing an example of the exterior of the battery unit 100 of FIG. 1. FIG. 2 illustrates an example of the exterior of the battery unit 100 in which the number of battery cells contained in the battery pack BPK is 6. However, embodiments of the invention are not limited to only six battery cells, and embodiments encompass any number of battery cells. For purposes of illustration, FIG. 2 does not show the battery pack BPK which holds the battery cells BC1-BC6.

As shown in FIG. 2, the battery unit 100 includes the battery cells BC1 to BC6 described above, the transmission modules TM1 to TM6, the reception module RM, and the magnetic core MC. For purposes of illustration, the connections from the reception module RM to the battery management unit 200 are not shown in FIG. 2.

As shown in FIG. 2, the battery cells BC1 to BC6 are stacked in the battery pack BPK. Furthermore, as shown in FIG. 2, the transmission module TMr (r is an integer of 1 through 6) is connected to one face of the battery cell BCr (r is an integer of 1 through 6). As shown in FIG. 2, the magnetic core MC runs through each of the transmission modules TM1-TM6 and the reception module RM. According to the embodiment shown in FIG. 2, the battery cells BC1 to BC6 are stacked in a vertical direction, and the transmission modules TM1 to TM6 are connected to side surfaces of the battery cells BC1 to BC6 in a horizontal direction, perpendicular to the vertical direction. In the embodiment shown in FIG. 2, the magnetic core MC extends along the side of the battery cells BC1 to BC6 in the vertical direction and passes through the transmission modules TM1 to TM6 and the reception module RM.

Figure 3:
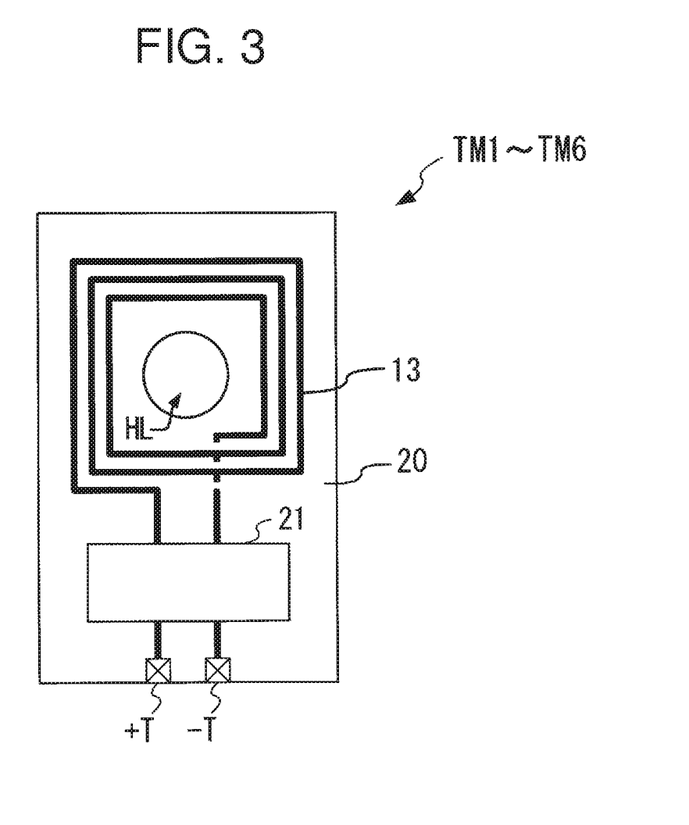
FIG. 3 is a plan view of each of transmission modules TM1 to TM6 from above.

FIG. 3 is a plan view of one of the transmission modules TM1 to TM6 from above. In one embodiment, the transmission modules TM1 to TM6 each have the same configuration. In some embodiments, the transmission modules TM1 to TM6 have the illustrated components in common.

As shown in FIG. 3 each of the transmission modules TM1 to TM6 includes a transmission antenna substrate 20, which is made of a hard material or film, such as a printed circuit board (PCB), a transmission loop antenna 13 formed on the transmission antenna substrate 20, a semiconductor chip 21, and a positive terminal +T and negative terminal −T.

In the semiconductor chip 21, the measurement unit 11 and the transmitter 12 are formed as in FIG. 1. In other words, the semiconductor chip 21 may include processing circuitry to receive input voltages +Q and −Q, measure a voltage and current, and generate an output signal to drive the antenna 13. The processing circuitry includes one or more processors, programmable arrays, comparators, memory, and other processing logic circuits. The processing circuitry may include signal modulation circuitry including phase-lock-loop and any other appropriate signal-modulation circuitry to generate the modulation signals MS.

The positive terminal +T and the negative terminal −T formed in the transmission antenna substrate 20 are electrically connected to the measurement unit 11 formed in the semiconductor chip 21. The positive terminal +T of the transmission module TMr (r is an integer of 1 through 6) is connected to the positive terminal +Q of the battery cell BCr (r is an integer of 1 through 6), and the negative terminal −T of the transmission module TMr is connected to the negative terminal −Q of the battery cell BCr.

The transmission antenna substrate 20 has formed therein a through hole HL that allows the magnetic core MC to be inserted in the through hole HL in a removable manner.

Furthermore, on the surface of the transmission antenna substrate 20, as shown in FIG. 3, the transmission loop antenna 13 is formed of metal wiring printed in a loop shape surrounding this through hole HL. The respective ends of the metal wiring forming the transmission loop antenna 13 are connected to the transmitter 12 formed in the semiconductor chip 21.

Figure 4:
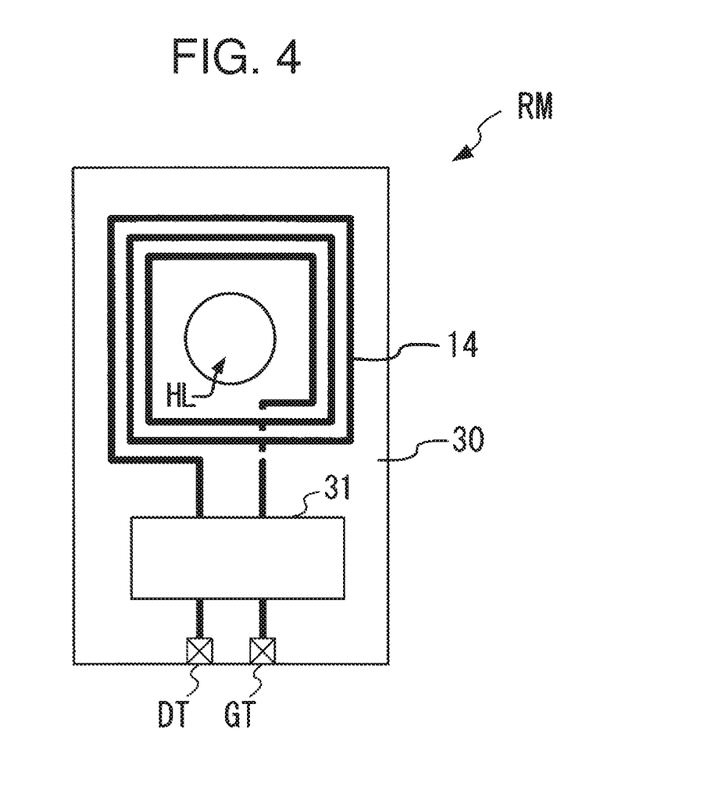
FIG. 4 is a plan view of a reception module RM from above.

FIG. 4 is a plan view of the reception module RM from above.

As shown in FIG. 4, the reception module RM includes a reception antenna substrate 30, which is made of a hard material or film, such as a PCB, a reception loop antenna 14 formed on the surface of the reception antenna substrate 30, a semiconductor chip 31, a data terminal DT, and a ground terminal GT.

In the semiconductor chip 31, the receiver 15 shown in FIG. 1 is formed. In other words, the semiconductor chip 31 includes circuitry, including signal processing circuitry, to receive an input signal from the antenna 14, including an AC input signal, and perform processing on the signal to generate the output data including the battery cell measurement information FD. Signal processing may include demodulation, rectification, and filtering, and the semiconductor chip 31 may accordingly include one or more rectifiers and filters. The semiconductor chip 31 may also include one or more processors and programmable arrays and other logic circuitry to demodulate the signal from the antenna 14, and convert the input signal from the antenna 14 into an output data signal.

The battery cell measurement information FD output from the receiver 15 is supplied to the battery management unit 200 via the data terminal DT and the ground terminal GT formed on the reception antenna substrate 30.

The reception antenna substrate 30 has formed therein a through hole HL that allows through the magnetic core MC in a removable manner.

Furthermore, on the surface of the reception antenna substrate 30, as shown in FIG. 4, the reception loop antenna 14 is formed of metal wiring printed in a loop shape surrounding this through hole HL. The respective ends of the metal wiring forming the reception loop antenna 14 are connected to the receiver 15 formed in the semiconductor chip 31.

The magnetic core MC is made of a magnetic material such as iron, silicon steel or ferrite. The magnetic core MC may have any cross-sectional shape, including a cylindrical shape or a square or rectangular column shape. Likewise, the through holes HL in the transmission modules TM and the reception module RM may have corresponding shapes, such as a circular shape for a cylindrical magnetic core MC or a square or rectangular shape for a square or rectangular column-shaped magnetic core MC. Embodiments of the invention are not limited to the above cross-sectional shapes, and the magnetic core MC may have any cross-sectional shape (including a hollow shape, a C-shape or U-shape, an oval shape, a hexagon or octagon, etc.).

As shown in FIG. 2, the magnetic core MC is inserted through the respective through holes HL of the transmission modules TM1 to TM6 and the reception module RM.

The reception module RM is located at an intermediate position between TM1 and TM6 arranged at the respective ends in the longitudinal direction of the magnetic core MC, among the transmission modules TM1 to TM6, and is located between TM3 and TM4 in the example shown in FIG. 2. In one embodiment, the reception module RM is positioned in a middle of a stack of battery cells BC, as shown in FIG. 2. In alternative embodiments, the reception module RM may be positioned at any location along the stack of battery cells BC, including at ends of the stack or any other location between the ends of the stack and the center of the stack.

As described above, in the battery unit 100 shown in FIGS. 1 to 4, the transmission modules TM1 to TMn measure the voltage value and the current amount of the respective battery cells BC1 to BCn, and transmit the information indicating the measurement result to the receiver 15 via wireless communication. Thereafter, the receiver 15 supplies the battery cell measurement information FD indicating the measurement result to the battery management unit 200.

Thus, the DC voltage generated in each battery cell BC1 to BCn is not applied on the battery management unit 200. This prevents a high voltage from being applied on the battery management unit 200 even if abnormality occurred in the battery cell, which makes it possible to prevent damage due to the abnormality.

The battery unit 100 does not have a plurality of wiring lines to connect the battery management unit 200 to the respective battery cells BC1 to BCn, and therefore, the space for the wiring lines is not needed. Thus, for this space that would have been used to accommodate the wiring lines, the capacity of each of the battery cells BC1 to BCn can be made larger, or the size of the battery unit 100 can be made smaller.

In the battery unit 100, short range (short distance) wireless communication adopting the magnetic field coupling is performed when the AC magnetic field generated in the transmission loop antenna 13 of the transmission modules TM1 to TMn activates the reception module RM and transmits the measurement information (ST). This eliminates the need for a special wiring line for supplying the power source voltage to the reception module RM. However, because the AC magnetic field is propagated through space, the communication range is a relatively short distance (such as approximately 10 cm).

Therefore, if a greater number of battery cells BC are used to increase the battery capacity, the distance between each transmission module TM connected to the battery cell BC at each end and the reception module RM is greater, which possibly prevents normal wireless communication.

In order to solve this problem, in the battery unit 100, the common magnetic core MC is inserted inside of the transmission loop antennas 13 of the transmission modules TM1 to TMn and the reception loop antenna 14 of the reception module RM. This makes it possible to suppress the attenuation of the AC magnetic field generated by the transmission loop antenna 13, allowing for a greater communication range.

As a result, an increase in size of the unit can be prevented due to the elimination of the power source wiring line that supplies power source to the reception module RM, and the battery capacity can be made larger by increasing the number of battery cells BC.

In the embodiment described above, the measurement unit 11 of each of the transmission modules TM1 to TMn is configured to measure the voltage value and the current amount of the battery cells, but may alternatively configured to measure the voltage value only.

Also, in the embodiment described above, the transmitter 12 supplies each transmission loop antenna 13 with the modulation signal MS obtained by performing modulation on the carrier wave of a prescribed frequency based on the measurement signal ST. However, the present invention is not limited to this configuration as long as the AC magnetic field corresponding to the measurement signal ST can be generated in the transmission loop antenna 13.

In other words, the battery unit 100 may be configured in any way as long as it includes first to n-th (n is an integer of 2 or greater) battery cells each generating a DC voltage, first to n-th measurement units, first to n-th transmission loop antennas, a reception loop antenna, a receiver, and a magnetic core.

The first to n-th measurement units (measurement unit 11 of TM1 to TMn) are configured to measure the voltage values of the respective first to n-th battery cells (BC1 to BCn), and obtain first to n-th measurement signals indicating the respective measurement results (measurement signal of TM1 to TMn). The first to n-th transmission loop antennas (transmission loop antennas 13 of TM1 to TMn) generate AC magnetic fields corresponding to the first to n-th measurement signals, respectively. The reception loop antenna (14) receives the AC magnetic field, and obtains a reception signal (RA) corresponding to this AC magnetic field. The receiver (15) conducts a demodulation process on the reception signal to generate battery cell measurement information representing the measurement result. The magnetic core (MC) runs through the first to n-th transmission loop antennas and the reception loop antenna.

According to the battery unit 100, it is possible to replace only the abnormal battery cell with a new battery cell among the battery cells BC1 to BCn contained in the battery pack BPK.

Figure 5:
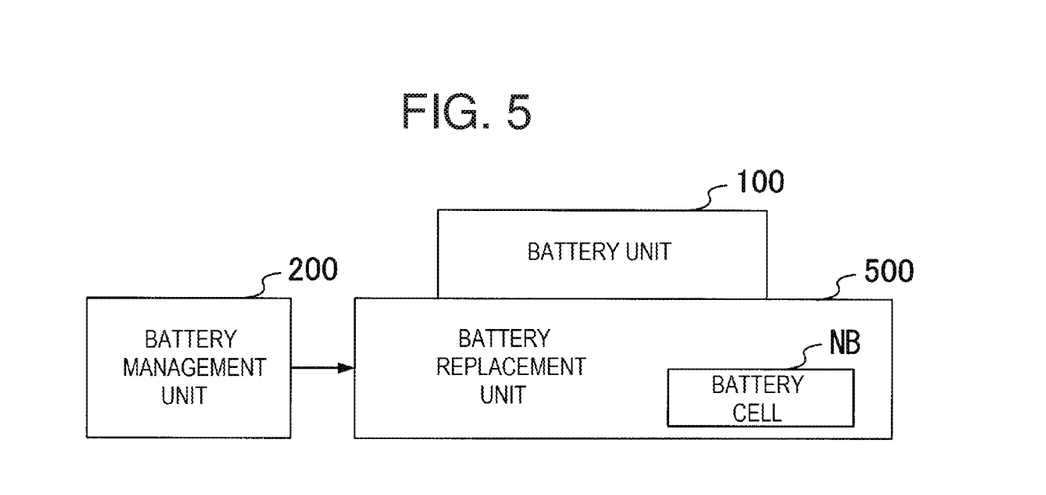
FIG. 5 is a block diagram showing the configuration of a replacement system to replace the battery cell with a new battery cell.

FIG. 5 is a block diagram showing the configuration of the replacement system to replace the battery cell with a new battery cell.

The replacement system in FIG. 5 includes the battery unit 100 having a battery cell to be replaced, the battery management unit 200 described above, and a battery replacement unit 500 that conducts the replacement process.

In order to replace a battery cell of the battery unit 100, first, the battery unit 100 is attached to the battery replacement unit 500.

Figure 6:
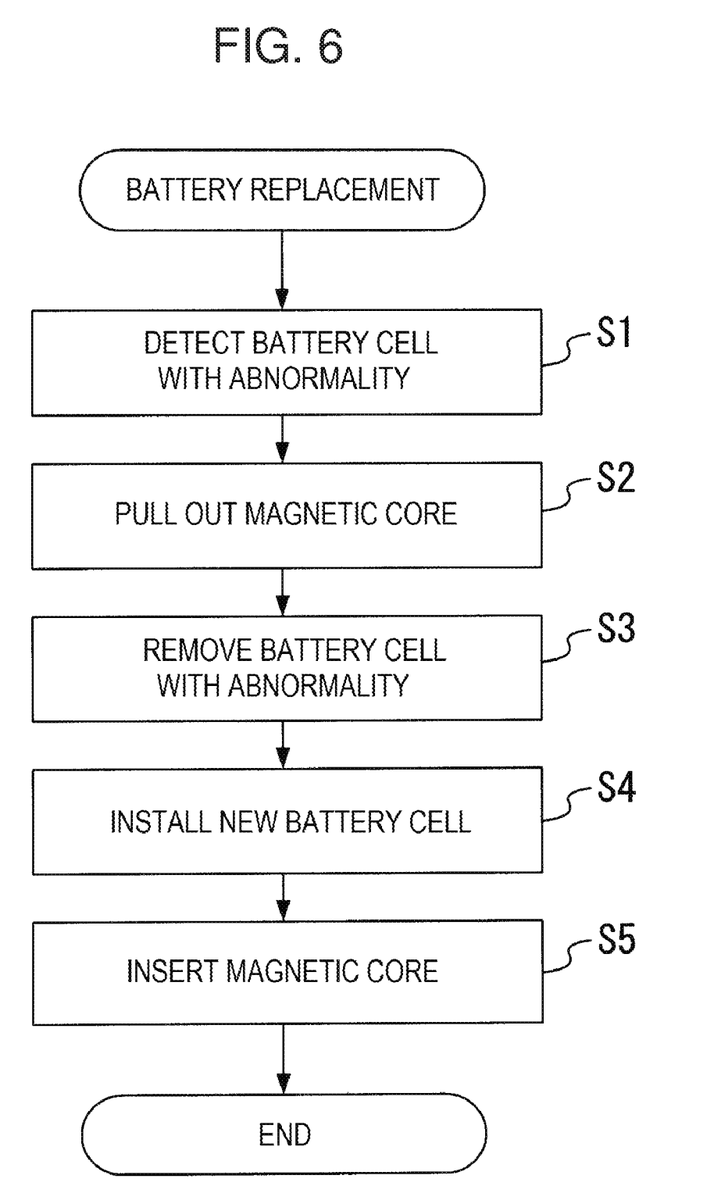
FIG. 6 is a diagram showing the battery replacement steps.

The battery replacement unit 500 then conducts the battery cell replacement in accordance with the battery replacement procedures shown in FIG. 6.

In FIG. 6, first, the battery replacement unit 500 takes in the battery state information generated in the battery management unit 200, and detects the battery cell with abnormality among the battery cells BC1 to BCn of the battery unit 100 based on the battery state information (Step S1).

Next, the battery replacement unit 500 pulls out the magnetic core MC placed in the through holes HL of the transmission modules TM1 to TMn of the battery unit 100 and the through hole HL of the reception module RM (Step S2).

Next, the battery replacement unit 500 removes the battery cell with abnormality detected in Step S1 (Step S4), and places a new battery cell NB in the position where the battery cell with abnormality was (Step S5).

Next, the battery replacement unit 500 inserts the magnetic core MC through the through holes HL of the transmission modules TM1 to TMn of the battery unit 100 and the through hole HL of the reception module RM (Step S6).

As described above, according to the battery unit 100, when the battery cell is to be replaced, all it takes is to pull out the magnetic core, and each battery cell can be removed. In one embodiment, the battery pack BPK holds the remaining battery cells BC in their respective positions while the defective battery cell is being replaced. Furthermore, after the new battery cell is placed, by inserting the magnetic core MC through the through holes HL of the transmission modules TM1 to TMn and the reception module RM, the battery unit 100 can be connected to the battery management unit 200.

Thus, it is possible to reduce the time required to replace the battery cell as compared to the battery unit in which the wiring lines connecting the battery cells to the battery management unit need to be removed and reconnected in the replacement process of the battery cell.

In this embodiment, the magnetic core MC is in a rod-like shape as shown in FIG. 2, but the magnetic core MC may be formed in a loop-like shape.

Figure 7:
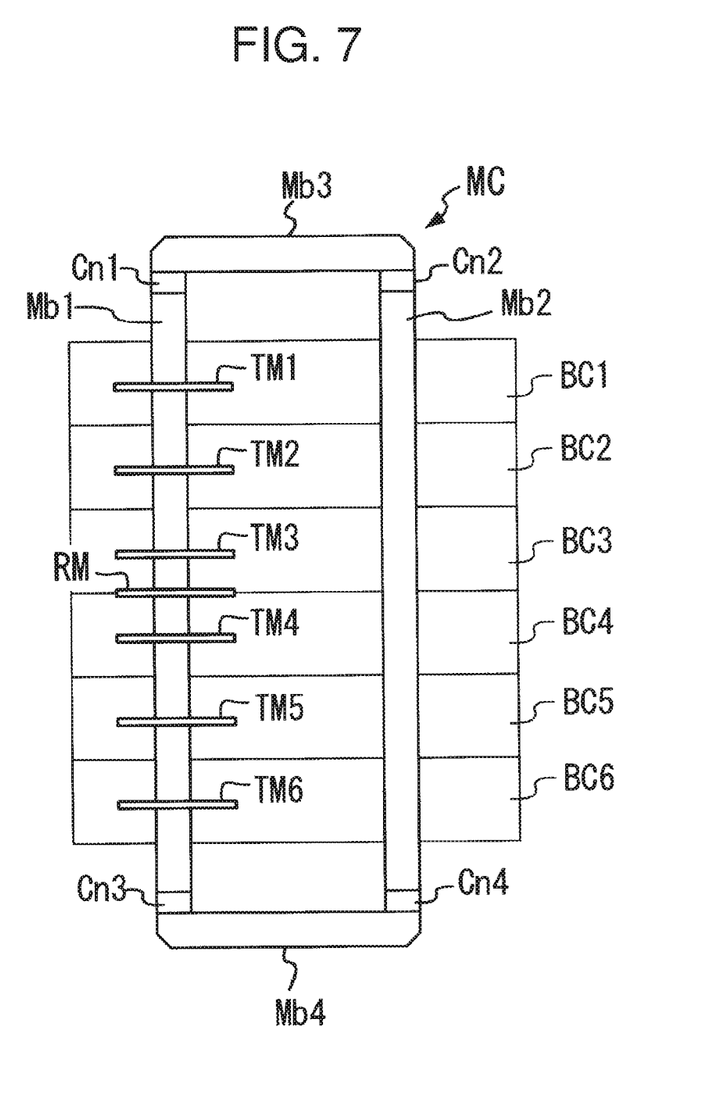
FIG. 7 is a front view showing an example of the front-side configuration of the battery unit 100 employing a loop-shaped magnetic core MC.

FIG. 7 is a front view showing the battery unit 100 employing a loop-shape magnetic core MC, viewed from the arrow direction shown n FIG. 2.

The magnetic core MC of FIG. 7 is formed by connecting four magnetic bars Mb1 to Mb4, which will be described below, to each other, and thus has a loop-like shape.

In FIG. 7, the magnetic bars Mb1 and Mb2 are each formed in a cylindrical or prism bar shape, or in any geometric cross-sectional shape. One end of the magnetic bar Mb3 is connected to one end of the magnetic bar Mb1 via a coupler Cn1, and the other end of the magnetic bar Mb3 is connected to one end of the magnetic bar Mb2 via a coupler Cn2. The couplers Cn1 and Cn2 couple the magnetic bars Mb1 and Mb2 with the magnetic bar Mb3 so as to be freely detached.

One end of the magnetic bar Mb4 is connected to the other end of the magnetic bar Mb1 via a coupler Cn3, and the other end of the magnetic bar Mb4 is connected to the other end of the magnetic bar Mb2 via a coupler Cn4. The couplers Cn3 and Cn4 couple the magnetic bars Mb1 and Mb2 with the magnetic bar Mb4 so as to be freely detached.

The magnetic bar Mb1 shown in FIG. 7 is inserted through the respective through holes HL of the transmission modules TM1 to TM6, and the through hole HL of the reception module RM.

By using the magnetic core MC having the loop-like shape as illustrated in FIG. 7, it is possible to retain, in the magnetic core MC, a greater amount of magnetic flux released from the transmission loop antennas 13 of the transmission modules TM1 to TM6. Thus, even if the output of the transmitter 12 is reduced as compared to the case in which the rod-shaped magnetic core MC as in FIG. 2 is used, the wireless communication between the transmission modules TM1 to TM6 and the reception module RM can still be carried out.

In the magnetic core MC shown in FIG. 7, the magnetic bars Mb3 and Mb4 can be detached from the magnetic bars Mb1 and Mb2 through the couplers Cn1 to Cn4. This makes it possible to remove a battery cell with abnormality, among the battery cells BC 1 to BC6, and replace it with a new battery cell.

In the embodiment described above, one transmission module is provided for one battery cell, but it is also possible to have two or more transmission modules for one battery cell in case the transmission module itself breaks down. It is also possible to have two or more reception modules. In an embodiment with two or more reception modules RM, each of the two or more reception modules RM may process transmitted signals from all of the transmission modules TM, or each of the reception modules RM may process only signals from a sub-set of the transmission modules TM. In other words, the outputs from the transmission modules TM may be divided among the multiple reception modules RM.

Figure 8:
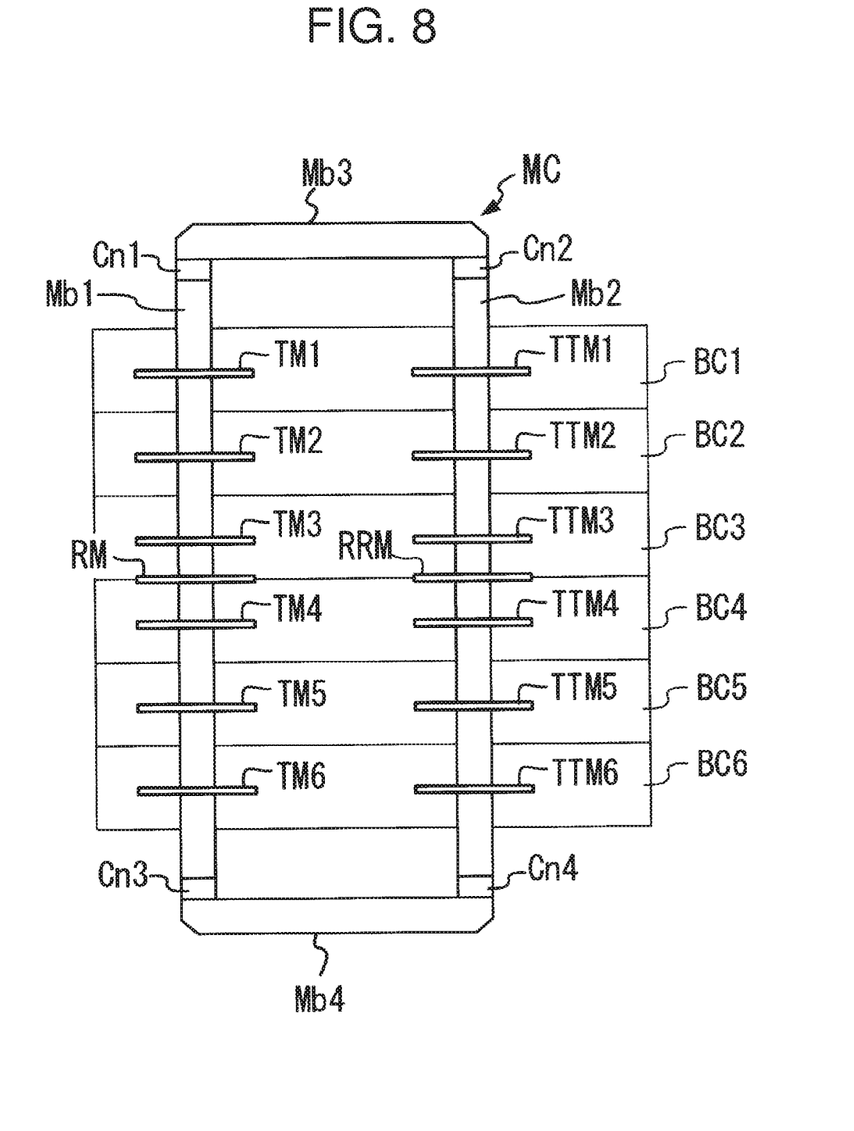
FIG. 8 is a front view showing another embodiment of the battery unit 100.

FIG. 8 is a front view showing another example of the front-side configuration of the battery unit 100, made in view of the above-mentioned situation. In the example of FIG. 8, one battery cell has two transmission modules having the same configuration as each other. Also, there are two reception modules having the same configuration as each other.

The configuration shown in FIG. 8 is the same as that of FIG. 7 except that auxiliary transmission modules TTM1 to TTM6 and an auxiliary reception module RRM are newly added.

The auxiliary transmission module TTMr (r is an integer of 1 through 6) has the same configuration as the transmission module TMr (r is an integer of 1 through 6). The auxiliary transmission module TTMr is connected to the battery cell BCr (r is an integer of 1 through 6) together with the transmission module TMr. Further, in the configuration shown in FIG. 8, the magnetic bar Mb2 of the magnetic core MC is inserted through the through holes HL of the respective auxiliary transmission modules TTM1 to TTM6 and the auxiliary reception module RRM.

In the initial setting at the time of shipment, in the configuration shown in FIG. 8, only one of the transmission module TMr (r is an integer of 1 through 6) and the auxiliary transmission module TTMr (r is an integer of 1 through 6) is operated. Only when abnormality occurs, the transmission module with abnormality is switched to the other. The transmission modules TM1 to TM6 and the auxiliary transmission modules TTM1 to TTM6 may be always operated at the same time.

In the example shown in FIG. 8, the first to n-th auxiliary transmission loop antennas having the same configuration as one set of the transmission loop antenna group constituted of the first to n-th transmission loop antennas (transmission loop antenna 13 of TM1 to TMn) are provided as an auxiliary transmission loop antenna group, but in addition, two or more auxiliary transmission loop antenna groups may be provided. In the example shown in FIG. 8, only one reception loop antenna (reception loop antenna 14 of RRM) having the same configuration as the reception loop antenna (reception loop antenna 14 of RM) is provided, but two or more reception loop antennas may be provided.

DESCRIPTIONS OF THE REFERENCE CHARACTERS

11 Measurement Unit
12 Transmitter
13 Transmission Loop Antenna

14 Reception Loop Antenna
15 Receiver
15 Transmission Antenna Substrate
20 Reception Antenna Substrate
BC1 to BCn Battery Cell
RM Reception Module
TM1 to TMn Transmission Module
100 Battery Unit
200 Battery Management Unit

What is claimed is:

1. A battery unit comprising:
first to n-th (n is an integer of 2 or greater) battery cells each configured to generate a DC voltage;
first to n-th measurement units each configured to measure a voltage value of a respective one of the first to n-th battery cells, and obtain first to n-th measurement signals that respectively represent measurement results;
first to n-th transmission loop antennas each configured to generate an AC magnetic field corresponding to the respective first to n-th measurement signals;
a reception loop antenna configured to receive the AC magnetic fields generated by the first to n-th transmission loop antennas, and to generate a reception signal corresponding to the first to n-th AC magnetic fields;
a receiver configured to perform demodulation on the reception signal to generate information representing the measurement results; and
a magnetic core that runs through the first to n-th transmission loop antennas and the reception loop antenna;
wherein
a through hole is formed in each of the first to n-th transmission loop antennas;
a through hole is formed in the reception loop antenna; and
the magnetic core is inserted through the through holes of the first to n-th loop antennas and the through hole of the reception loop antenna.

2. The battery unit according to claim 1, further comprising:
first to n-th transmission antenna substrates respectively having the first to n-th transmission loop antennas formed thereon, the first to n-th transmission antenna substrates each having the through hole that is located inside the transmission loop antenna; and
a reception antenna substrate having the reception loop antenna formed thereon, the reception antenna substrate having the through hole that is located inside the reception loop antenna,
wherein the transmission loop antenna is made of a metal wiring line printed in a loop-like shape surrounding the through hole of the transmission antenna substrate on the surface of the transmission antenna substrate, and
wherein the reception loop antenna is made of a metal wiring line printed in a loop-like shape surrounding the through hole of the reception antenna substrate on the surface of the reception antenna substrate.

3. The battery unit according to claim 2, wherein an r-th (r is an integer of 1 through n) transmission antenna substrate is formed in an r-th battery cell.

4. The battery unit according to claim 1, further comprising:
at least one set of first to n-th auxiliary measurement units each configured to measure the voltage value of a respective one of the first to n-th battery cells, and obtain first to n-th auxiliary measurement signals that respectively represent the measurement results;
at least one set of first to n-th auxiliary transmission loop antennas each configured to generate an auxiliary AC magnetic field corresponding to the respective first to n-th auxiliary measurement signals; and
at least one auxiliary reception loop antenna configured to receive the auxiliary AC magnetic fields generated by the first to n-th auxiliary transmission loop antennas, and to generate an auxiliary reception signal corresponding to the first to n-th auxiliary AC magnetic fields.

5. The battery unit according to claim 4, wherein the magnetic core has a loop shape, the first to n-th transmission antennas and the reception loop antenna are located on one side of the loop shape, and the first to n-th auxiliary transmission antennas and the auxiliary reception loop antenna are located on an opposite side of the loop shape.

6. The battery unit according to claim 1, wherein the magnetic core is in a column shape.

7. The battery unit according to claim 1, wherein the magnetic core is in a loop shape.

8. The battery unit according to claim 1, wherein:
the first to n-th transmission loop antennas are included in respective first to n-th transmission modules;
the reception loop antenna is included in a reception module;
the first to n-th battery cells are arranged in a stack; and
the first to n-th transmission modules and the reception module are aligned in a stacking direction of the stack.

9. A battery monitoring system, comprising:
first to n-th (n is an integer of 2 or greater) battery cells each configured to generate a DC voltage;
first to n-th measurement units each configured to measure a voltage value of a respective one of the first to n-th battery cells, and obtain first to n-th measurement signals respectively representing measurement results;
first to n-th transmission loop antennas each configured to generate an AC magnetic field corresponding to the respective first to n-th measurement signals;
a reception loop antenna configured to receive the AC magnetic fields generated by the first to n-th transmission loop antennas, and to generate a reception signal corresponding to the AC magnetic fields;
a receiver unit configured to perform demodulation on the reception signal to generate battery cell measurement information representing the measurement results;
a magnetic core that runs through the first to n-th transmission loop antennas and the reception loop antenna; and
a battery management unit configured to monitor a state of the first to n-th battery cells and control a discharge or charge process of the first to n-th battery cells, based on the battery cell measurement information;
wherein
a through hole is formed in each of the first to n-th transmission loop antennas;
a through hole is formed in the reception loop antenna; and
the magnetic core is inserted through the through holes of the first to n-th loop antennas and the through hole of the reception loop antenna.

10. A battery replacement method of a battery unit that includes first to n-th (n is an integer of 2 or greater) battery cells each configured to generate a DC voltage; first to n-th measurement units each configured to measure a voltage value of a respective one of the first to n-th battery cells, and to generate first to n-th measurement signals respectively representing measurement results; first to n-th transmission loop antennas formed respectively in the first to n-th battery cells and configured to generate an AC magnetic field corresponding to each of the first to n-th measurement signals; a reception loop antenna configured to receive the AC magnetic fields and to generate a reception signal corresponding to the AC magnetic fields; a receiver configured to conduct a demodulation process on the reception signal to generate battery cell measurement information representing the measurement results; and a magnetic core that runs through the first to n-th transmission loop antennas and the reception loop antenna, the battery replacement method comprising:

detecting a battery cell with an abnormality among the first to n-th battery cells forming a stack;

removing the magnetic core from the first to n-th transmission loop antennas and the reception loop antenna;

removing, from the stack of the first to n-th battery cells, the battery cell with the abnormality;

installing a new battery cell into the stack in a location corresponding to the battery cell with the abnormality; and     inserting the magnetic core through the first to n-th transmission loop antennas and the reception loop antenna;

wherein a through hole is formed in each of the first to n-th transmission loop antennas;

a through hole is formed in the reception loop antenna; and         the magnetic core is inserted through the through holes of the first to n-th loop antennas and the through hole of the reception loop antenna.

\* \* \* \* \*